(12) United States Patent
Sasaki et al.

(10) Patent No.: US 8,292,081 B2
(45) Date of Patent: Oct. 23, 2012

(54) SUBSTRATE STORAGE CONTAINER

(75) Inventors: Shigenobu Sasaki, Itoigawa (JP); Shinichi Ohori, Itoigawa (JP); Hiroki Yamagishi, Saitama (JP)

(73) Assignee: Shin-Etsu Polymer Co., Ltd., Tokyo (JP)

(*) Notice: Subject to any disclaimer, the term of this patent is extended or adjusted under 35 U.S.C. 154(b) by 332 days.

(21) Appl. No.: 12/301,123

(22) PCT Filed: May 21, 2007

(86) PCT No.: PCT/JP2007/060375
§ 371 (c)(1),
(2), (4) Date: Nov. 17, 2008

(87) PCT Pub. No.: WO2007/138913
PCT Pub. Date: Dec. 6, 2007

(65) Prior Publication Data
US 2009/0206001 A1    Aug. 20, 2009

(30) Foreign Application Priority Data
May 29, 2006  (JP) ................. 2006-147534

(51) Int. Cl.
B65D 85/90  (2006.01)
(52) U.S. Cl. ......... 206/710; 277/628; 277/641; 277/644
(58) Field of Classification Search ............... 206/711, 206/710; 220/806, 378; 277/237, 641, 644, 277/651, 628, 626
See application file for complete search history.

(56) References Cited

U.S. PATENT DOCUMENTS

| 5,009,036 | A | * | 4/1991 | Ryan ........................ 49/489.1 |
| 5,112,065 | A | * | 5/1992 | Meyer et al. ............. 277/634 |
| 5,997,008 | A | * | 12/1999 | Pflug ....................... 277/626 |
| 6,220,438 | B1 | | 4/2001 | Hirohata et al. |
| 6,273,261 | B1 | | 8/2001 | Hosoi |
| 6,315,124 | B1 | | 11/2001 | Hirohata et al. |

(Continued)

FOREIGN PATENT DOCUMENTS
JP   11-195698 A   7/1999
(Continued)

OTHER PUBLICATIONS

International Preliminary Report on Patentability issued in PCT Application No. PCT/JP2007/060375 dated Dec. 10, 2008 (1 page).

(Continued)

*Primary Examiner* — J. Gregory Pickett
*Assistant Examiner* — Andrew Perreault
(74) *Attorney, Agent, or Firm* — Osha Liang LLP (57) ABSTRACT

A container includes: a container body for storing substrates of semiconductor wafers; a door element detachably fitted to an open front portion of the container body; and a compressively deformable gasket for sealing between the container body and the door element. While a sealing surface for the gasket is formed on an inner periphery of an open front portion of the container body so that the difference between the maximum and minimum of a flatness is less than 0.50 mm, a fitting portion for the gasket is formed in a frame shape. The gasket is formed of a base fitted to the fitting portion; a flexible sealing part extended from the base toward the sealing surface; and a contact portion that is curvedly formed at a distal end of the sealing part and put in press-contact with the sealing surface.

8 Claims, 9 Drawing Sheets

U.S. PATENT DOCUMENTS

| | | | |
|---|---|---|---|
| 6,354,601 B1 * | 3/2002 | Krampotich et al. | 277/628 |
| 6,491,177 B1 | 12/2002 | Hyobu | |
| 7,029,013 B2 * | 4/2006 | Yajima et al. | 206/710 |
| 7,413,099 B2 * | 8/2008 | Takahashi et al. | 206/710 |
| 7,832,736 B2 * | 11/2010 | Takahashi et al. | 277/592 |
| 2002/0195455 A1 | 12/2002 | Takahashi et al. | |
| 2003/0107187 A1 | 6/2003 | Yajima et al. | |
| 2005/0274645 A1 | 12/2005 | Hasegawa et al. | |

FOREIGN PATENT DOCUMENTS

| | | |
|---|---|---|
| JP | 11-297807 A | 10/1999 |
| JP | 2000-289795 A | 10/2000 |
| JP | 2000-315721 A | 11/2000 |
| JP | 2002-68364 A | 3/2002 |
| JP | 2002-299428 A | 10/2002 |
| JP | 2005-5525 A | 1/2005 |
| JP | 2005-256958 A | 9/2005 |
| JP | 2005-353898 A | 12/2005 |
| WO | 02/47154 A1 | 6/2002 |

OTHER PUBLICATIONS

Notification of Transmittal of the International Preliminary Report of Patentability issued in PCT/Application No. PCT/JP2007/060375 dated Dec. 24, 2008 (1 page).

PCT Written Opinion issued in PCT Application No. PCT/JP2007/060375 dated May 21, 2007 (6 pages).

Patent Abstracts of Japan Publication No. 2005-5525; Publication date Jan. 6, 2005 (1 page).

Patent Abstracts of Japan Publication No. 11-195698; Publication date Jul. 21, 1999 (1 page).

Patent Abstracts of Japan Publication No. 2005-256958; Publication date Sep. 22, 2005 (1 page).

Patent Abstracts of Japan Publication No. 2002-299428; Publication date Oct. 11, 2002 (1 page).

International Search Report from PCT/JP2007/060375 dated Aug. 14, 2007 (4 pages).

* cited by examiner

SUBSTRATE STORAGE CONTAINER

TECHNICAL FIELD

The present invention relates to a substrate storage container in which when a door element is fitted to the opening of a container body that stores substrates such as semiconductor wafers, glass masks and the like, the interface between these, the container body and the door element is sealed by a gasket.

BACKGROUND ART

In recent years, substrates of semiconductor wafers have been enlarged in diameter from 200 mm type to 300 mm type, and are set to predetermined processing equipment or shipped from the factory while they remain stored in a dedicated substrate storage container. A substrate storage container of this type, includes: as partially shown in FIG. 18, a front open box type container body for storing substrates of semiconductor wafers in alignment; a door element that is removably fitted to the open front portion of the container body; and an elastic gasket that seals between the container body and the door element by deformation, and is designed to be large-sized for increase in diameter of substrates (see Patent document 1).

The container body of the substrate storage container is injection molded of a molding material with a predetermined thickness so as to obtain a certain strength, and a plurality of teeth that horizontally support substrates are arranged in parallel, on both interior sides, in other words, or on the interior surface of both side walls. On either side of the bottom a bottom rail that is contiguous to the rim of the open front portion is integrally formed by the interposition of a thick reinforcing rib for providing rigidity. This container body includes a mount rib for a robotic flange integrally formed on its top, engaging ribs for the door element formed on both sides along the rim of the open front portion, and attachment ribs for control handles integrally formed on the exterior wall surface on both sides.

The door element is formed in such a shape as to fit to the open front portion of the container body, and is formed on both sides with a pair of engaging pieces that each are pivotally supported to engage the engaging ribs on the container body. The gasket is formed of elastomer materials and is comprised of a frame-shaped base that is fitted to the periphery of the door element and a flexible sealing part that is extended from this base and tapered outwards, and deforms by compression between the sealing surface of the open front portion of the container body and the door element.
Patent Document 1:
Japanese Patent Application Laid-open 2002-68364

DISCLOSURE OF INVENTION

Problems to be Solved by the Invention

Since the conventional substrate storage container is constructed as above, there is the problem that if the dimensional variations of the container body and the gasket build up, it becomes difficult to seal the full circumference between the container body and the door element, causing air and others to penetrate into the container body and contaminate the substrates.

This problem may be explained as follows. Since the container body of the conventional substrate storage container is molded so that it has walls having a predetermined heavy thickness so as to assure the certain strength while the teeth, bottom rails, reinforcing ribs, mount rib, engaging ribs and attachment ribs are formed in the container body, it is impossible to make the wall thickness uniform, hence there is a fear that sink, deformation and other faults occur during molding. Further, since in the conventional container body the front part of the reinforcing rib for providing rigidity, is connected, and integrally and thickly formed, with the rim and the like of the open front portion, there is a fear that the open front portion may cause sink during molding due to increase in thickness, hence producing depressions on the sealing surface in the open front portion.

On the other hand, since the gasket is formed of elastomer material, it is basically poor in shape stability and is prone to be deformed by the loads during storage, or due to shrinkage after molding or other reasons. In particular, since the sealing part of the gasket is tapered off, the sealing part is cooled first in the distal part than in the proximal part, hence the gasket has a feature that the distal part of the sealing part tends to deform in a wave like pattern.

When the dimensional variations due to lack of uniformity of wall thickness of the container body and the dimensional variations due to poor shape stability of the gasket build up, it becomes difficult to tightly seal the interface around the full circumference between the open front portion of the container body and the door element. As a result there occurs the problem that the outside air and other elements penetrate into the container body through the areas where sealing is weak, contaminating the substrates therein.

The present invention has been devised in view of the above, it is therefore an object of the present invention to provide a substrate storage container which prevents air and others from penetrating into the container body and contaminating the substrates therein, by suitably sealing the interface between the container body and the door element.

Means for Solving the Problems

In order to solve the above problem, in the present invention, a container comprising: a container body for storing substrates; a door element to be fitted to the opening of the container body; and a compressively deformable gasket for sealing between the container body and the door element, is characterized in that a gasket fitting portion is formed on either the inner periphery of the opening of the container body or the door element while a sealing surface for the gasket is formed on the other so that the difference between the maximum and the minimum of the flatness is specified to be less than 0.50 mm, and, the gasket includes: a base to be fitted to the fitting portion; a flexible sealing part extended from the base toward the sealing surface; and a contact portion that is formed in the sealing part and contacts the sealing surface.

It is preferable that the compressive force necessary to compress and deform the gasket when the door element is fitted into the opening of the container body is specified to range from 35 to 100 N.

It is also possible that the substrates are semiconductor wafers having a diameter of 300 mm or greater, the container body is constructed of a front open box for storing semiconductor wafers of 300 mm or greater in diameter, with its front side formed as the opening, and a plurality of ribs are formed near the rim of the opening.

Further, it is possible that engaging ribs are formed on both sides of the rim of the opening of the container body while the door element has engaging pieces pivotally supported on both sides thereof to be engaged with the engaging ribs of the container body.

It is also possible that the distal end of the sealing part is formed to be the contact portion, and the width W from the proximal end of the sealing part to the distal end of the contact portion is specified to range from 5 to 10 mm.

Further, it is possible that the distal end of the sealing part is curved in a direction that intersects the direction in which the sealing part is extended so as to be the contact portion, and the width W from the proximal end of the sealing part to the distal end of the contact portion is specified to range from 5 to 10 mm.

It is also preferable that the ratio (W/FL) of the width W (mm) from the proximal end of the sealing part to the distal end of the contact portion to the flexed length FL (mm) when the gasket seals between the container body and the door element is specified to range from 1.5 to 4.

Further, in the case where the length of the sealing part when the contact portion of the gasket begins to contact the sealing surface is denoted as L1 and the length of the sealing part when the contact portion of the gasket is put in contact with the sealing surface and flexed is denoted as L2, it is preferable that the difference between these L1 and L2 is defined as the flexed length FL of the sealing part when the gasket seals between the container body and the door element.

Also, the gasket may be formed in an approximately frame-like shape, and the sealing part may have a different length in a partial section of, at least, one side from the length of the remaining part, the sealing part in the partial section being extended more than the sealing part in the remaining part.

Also, the sealing part in the partial section may be extended 0.8 to 1.2 times longer than the sealing part in the remaining part.

Also, the sealing part in the partial section may be positioned in the area where the sealing surface flatness becomes maximum or minimum, or may be positioned in the area on the sealing surface most distant from the engaging pieces of the door element.

Also, the sealing part in the partial section may be positioned in the area where the flatness of the sealing surface varies.

Further, the gasket base may be molded of thermoplastic resin and the sealing part and contact portion may be molded of thermoplastic elastomer or rubber so as to integrate the sealing part with the base.

Also, the gasket may be formed of a base to be fitted into the fitting portion having an approximately groove-like section, a flexible sealing part that is formed around the peripheral exposed portion of the base, exposed from the fitting portion and extends toward the sealing surface, a contact portion that is formed in this sealing part and put in contact with the sealing surface, a first group of projections that project from one peripheral side of the base that opposes the inner surface of the fitting portion and contacts the inner surface of the fitting portion, and a second group of projections that project from the other peripheral side of the base that opposes the opposite inner surface opposite to the inner surface of the fitting portion and contacts the opposite inner surface of the fitting portion.

Further, each of the first and second groups of projections may be formed of an exposed side projection located close to the exposed portion of the peripheral surface of the base and a normal projection located near the interior bottom of the peripheral surface of the base, closer to the interior bottom of the fitting portion than the exposed side projection is.

Also, the roots of the exposed side projections in the first and second groups of projections are formed at approximately opposing positions across the base and the exposed side projections of the first and/or second groups of projections may be formed thicker than the normal projections.

Further, the first and second groups of projections may be formed to be gradually shorter from the exposed portion of the peripheral surface of the base toward the interior bottom of the peripheral surface.

The exposed side projections in the first and/or second groups of projections may be tapered.

Also, the exposed side projections in the first and second groups of projections may be curvedly formed from the interior bottom side of the peripheral surface of the base toward the exposed portion of the peripheral surface.

It is also possible that the normal projections in the first and second groups of projections is tapered.

Moreover, the normal projections in the first and second groups of projections may be also curvedly formed from the interior bottom side of the peripheral surface of the base toward the exposed portion of the peripheral surface.

Further, in order to solve the above problems, the present invention is a container comprising: a container body molded of molding material in a front open box type for storing substrates; a door element to be fitted to the opening at the front of the container body; and a compressively deformable gasket for sealing between the container body and the door element, and is characterized in that the opening of the container body is projected sidewards and outwards forming a rim portion, a sealing surface for the gasket is formed on the inner surface of the rim portion, the container body is formed with a reinforcing rib directed toward the rim portion, and the opposing portion of the reinforcing rib that opposes the rim portion of the container body is reduced in thickness so as to prevent a depression from forming in the sealing surface of the rim portion during molding the container body.

Here, the opposing portion of the reinforcing rib may be formed to be discontinuous to the rim portion of the container body so as to reduce the thickness of the opposing portion of the reinforcing rib.

Also, the opposing portion of the reinforcing rib may be joined continuously to the rim portion of the container body, and a through hole may be formed in the opposing portion of the reinforcing rib so as to reduce the thickness of the opposing portion of the reinforcing rib.

Also, the opposing portion of the reinforcing rib may be joined continuously to the rim portion of the container body, and the opposing portion of the reinforcing rib may be reduced in thickness so that the thickness of the opposing portion of the reinforcing rib is less than two-thirds or less of the thickness of the proximal portion.

Further, a plurality of reinforcing ribs directed in the front-to-rear direction of the container body may be formed in the bottom surface at the bottom of the container body, the front part of the each reinforcing rib being formed to be the opposing portion.

Moreover, bottom rails for transportation may be formed on the both sides at the bottom of the container body by means of reinforcing ribs, the front part of each reinforcing rib being formed to be the opposing portion.

Here, the substrates defined in the scope of the claims may at least include a single or plurality of semiconductor wafers, glass masks and the like. As to the semiconductor wafers it does not matter whether they are of a 200 mm type, 300 mm type or 450 mm type. Further, the container body is not particularly limited to being either a front open box type, top open box type, transparent type, opaque type, translucent type or the like.

Similarly to the container body, the door element is not particularly limited to being either a transparent type, opaque type, translucent type or the like. Further, the gasket fitting portion may be formed on either the inner periphery of the opening of the container body or on the rim of the door element. The sealing surface also may be formed on either the inner periphery of the opening of the container body or on the rim of the door element. Further, the gasket may be manufactured by using predetermined materials such as thermoplastic elastomers including polyester-based elastomers, polyolefin-based elastomers, fluorine-based elastomers and urethane-based elastomers, fluororubber, EPDM, silicone rubber and the like, alone or in combination of more kinds.

The gasket may have an endless annular shape or frame-like shape or may be of a plurality of soft strips arranged circumferentially between the container body and the door element. The gasket base and the sealing part may either be, or need not be, formed of the same material. For example, the base may be molded of a hard plastic, a hard rubber having a hardness of 80 Hs or greater, or a hard thermoplastic elastomer while a sealing part molded of an elastic material may be bonded to part of the peripheral surface of the base, to thereby improve sealing performance and handling performance. Further, the section of the base is not particularly limited to being either an approximately L-shaped, rectangular, trapezoidal, polygonal, circular or elliptic form.

According to the present invention, since the opposing portion of the reinforcing rib that is provided continuously or discontinuously relative to the rim portion of the container body is reduced in thickness compared to the conventional configuration, when the container body, formed of molding material, is cooled, the phenomenon that the sealing surface for the gasket is stretched to form depressions due to shrinkage of the reinforcing ribs occurring due to a cooling delay, occurs less. Hence, the sealing surface in contact with the gasket is molded in a favorable manner.

Effect of the Invention

According to the present invention, since the interface between the container body and the door element can be suitably sealed to suppress degradation of sealing performance during storage of substrates and in other occasions, the present invention has an effect that it is possible to prevent air and others from penetrating into the container body from without and contaminating the substrates therein.

Further, specifying the compression force required for compressing and deforming the gasket when the door element is fitted to the opening of the container body within the range of 35 to 100N can produce favorable sealing performance, and can suppress increase in equipment load when the door element is fitted to the opening of the container body.

Further, when the distal end of the sealing part is formed to be the contact portion and the width W from the proximal end of the sealing part to the distal end of the contact portion is specified to range from 5 to 10 mm, it is possible to optimize the amount of flexing and hence produce uniform sealing. It is also possible to prevent increase in the amount of deformation during molding and prevent the gasket from excessively contacting and sticking.

Further, when the ratio (W/FL) of the width W (mm) from the proximal end of the sealing part to the distal end of the contact portion to the flexed length FL (mm) of the sealing part when the gasket seals between the container body and the door element is specified within the range from 1.5 to 4, it is possible to prevent the compressive strength of the gasket from excessively increasing more than needed and prevent the door element from being hard to be removed due to close contact of the gasket to the sealing surface. It is also possible to prevent degradation of the sealing performance of the gasket due to dimensional errors, deformation, change in external environment and other factors.

Further, the opening of the container body is projected sidewards and outwards forming a rim portion, a sealing surface for the gasket is formed on the inner surface of the rim portion, the container body is formed with a reinforcing rib directed toward the rim portion, and the opposing portion of the reinforcing rib to the rim portion of the container body is reduced in thickness so as to prevent a depression from forming in the sealing surface of the rim portion during molding the container body, it is hence possible to reduce the difference between the maximum and minimum of the flatness of the sealing surface to less than 0.50 mm, and it is possible to suppress degradation of sealing performance during storage of substrates and in other occasions.

| Description of Reference Numerals | |
| --- | --- |
| 1 | container body |
| 2 | teeth |
| 3 | bottom rail |
| 4 | reinforcing rib (rib) |
| 4A | reinforcing rib |
| 4a | opposing proximal portion (opposing portion) |
| 6 | mount rib |
| 7 | open front portion (opening) |
| 8 | inside flange (opening inner rim) |
| 9 | inclined flange (opening inner rim) |
| 10 | outside flange |
| 11 | sealing surface |
| 11a | distant site |
| 12 | engaging rib (rib) |
| 13 | attachment rib |
| 14 | opening top portion (opening) |
| 18 | through hole |
| 20 | door element |
| 22 | fitting portion |
| 22A | fitting portion |
| 25 | engaging piece |
| 30 | gasket |
| 30a | mid portion |
| 30b | corner portion |
| 31 | base |
| 34 | sealing part |
| 36 | contact portion |
| 37 | first group of projections |
| 37A | second group of projections |
| 38 | exposed side projections |
| 39 | normal projections |

BEST MODE FOR CARRYING OUT THE INVENTION

Referring next to the drawings, a preferred embodied mode of the present invention will be described. As shown in FIGS. 1 to 6, a substrate storage container in the present embodiment includes: a container body 1 of a front open box type for storing substrates; a door element 20 removably fitted into open front portion 7 of this container body 1; and a compressively deformable endless gasket 30 for sealing between these container body 1 and door element 20, and is constructed such that a sealing surface 11 for gasket 30 is formed on the inner periphery of open front portion 7 of container body 1 while door element 20 is formed with a fitting portion 22 for gasket 30 and gasket 30 is formed in a frame-like shape made of a base 31, a sealing part 34 and a contact portion 36.

Though not illustrated, the substrate is, for example a thin circular semiconductor wafer having a diameter of 300 mm, and a plurality of wafers are vertically arranged in alignment and stored inside container body 1. These semiconductor wafers are transported to a manufacturing factory for semiconductor parts, where the wafers undergo various processes and shaping for metal thin-film forming and the like such as oxidation, exposure, etching, photolithography and sputtering so that electronic circuits are formed on their surface.

Container body 1 and door element 20 are formed using a predetermined molding material, or for example, thermoplastic resin such as polycarbonate, polybutylene terephthalate, cycloolefin polymer, polyether imide, polyether sulfone, polyether ketone, etc. This thermoplastic resin is blended with fillers and additives, including conducive components such as conductive carbon, carbon nanotubes, conductive fibers, metal fibers, conductive high polymers, etc., antistatic agents, UV absorbers and the like, as required.

Figure 1:
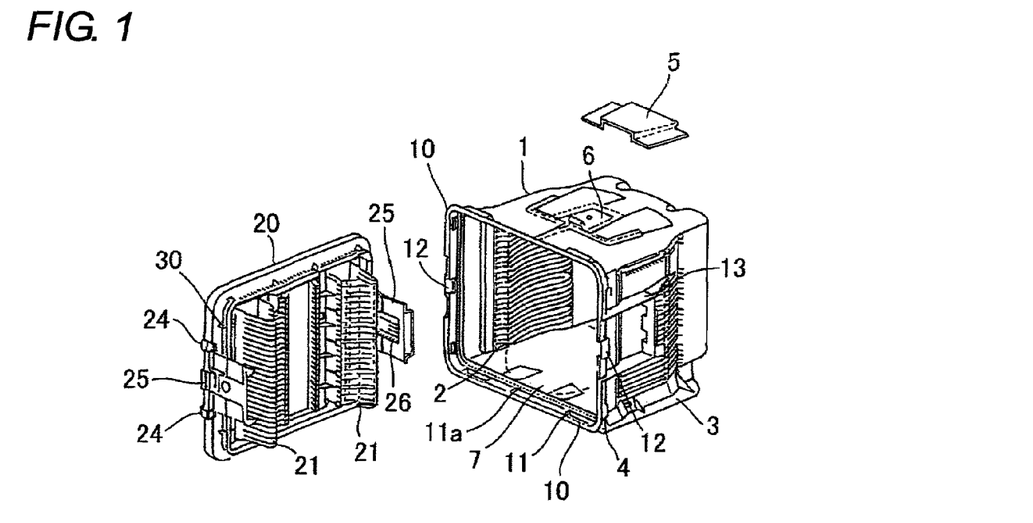
FIG. 1 is an exploded perspective illustrative view schematically showing an embodiment of a substrate storage container according to the present invention.
Figure 2:
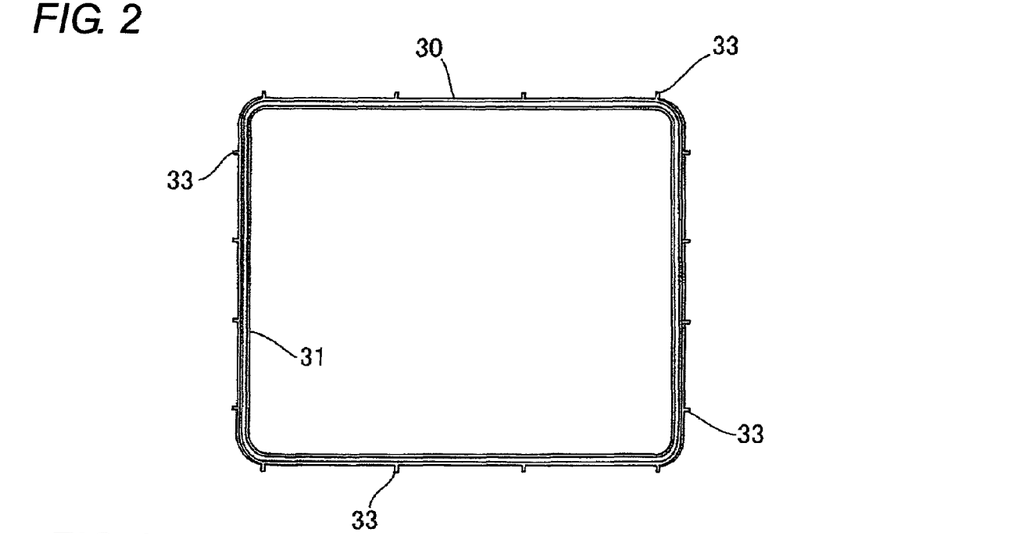
FIG. 2 is a front illustrative view schematically showing a gasket in an embodiment of a substrate storage container according to the present invention.
Figure 3:
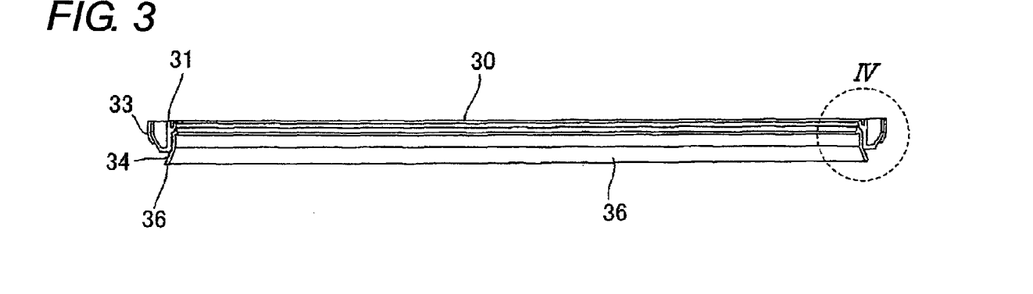
FIG. 3 is an illustrative view schematically showing a gasket in an embodiment of a substrate storage container according to the present invention.

As shown in FIG. 1, container body 1 is formed by injection molding using the aforementioned molding material with a predetermined wall thickness so as to obtain a certain strength, and a plurality of teeth 2 that horizontally support substrates at their periphery on both sides are arranged vertically with a predetermined pitch on both interior sides or on the interior surface of both side walls.

Container body 1 includes: positioning tools that have V-grooves into which a plurality of positioning pins projected from substrate processing equipment (not shown), attached to the underside of the bottom part thereof and arranged in a predetermined pattern; bottom rails 3 for transportation, integrally formed on both sides in the bottom part from front to rear from the periphery of open front portion 7, via reinforcing ribs 4 of about 3 mm thick as shown in FIG. 1; and a mount rib 6 for a detachable robotic flange 5 that is held by an unillustrated transport robot, integrally formed in the center on the top.

Figure 5:
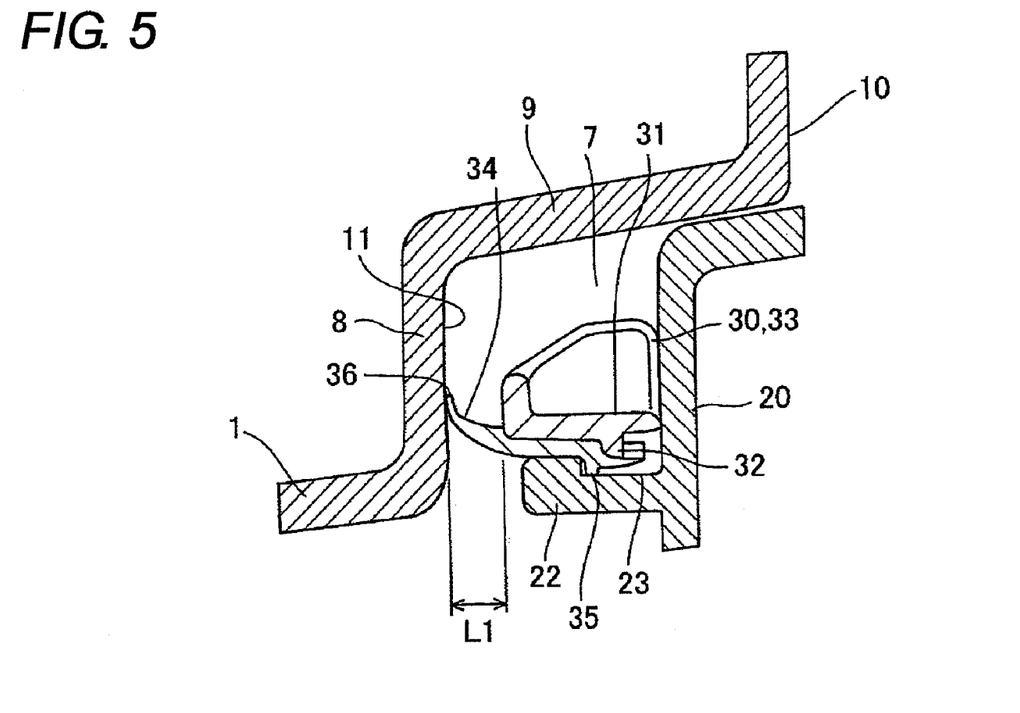
FIG. 5 is a sectional illustrative view schematically showing the relationship between a container body, a door element and a gasket in an embodiment of a substrate storage container according to the present invention.
Figure 6:
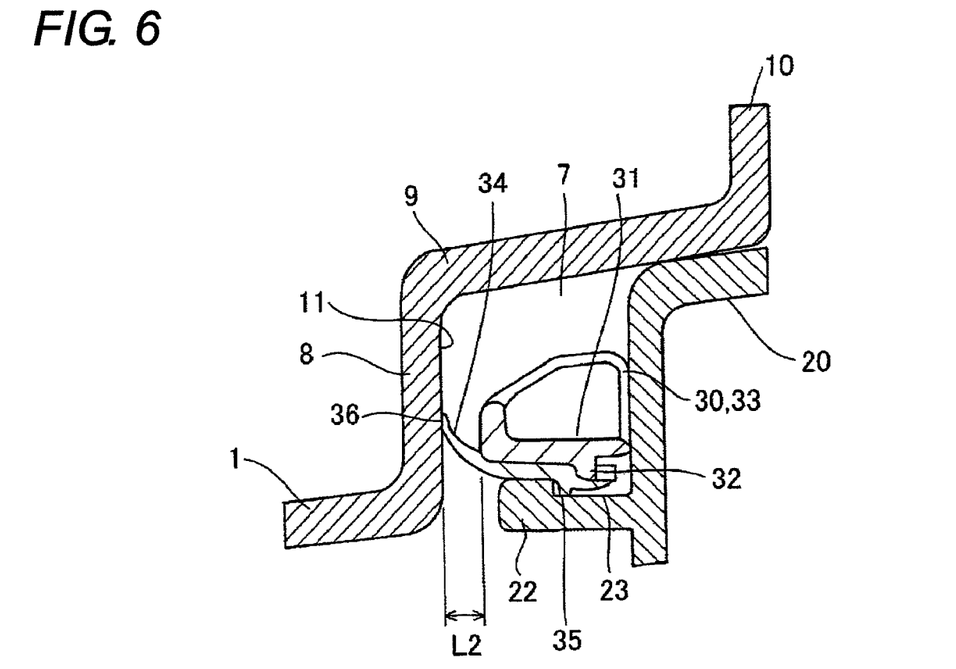
FIG. 6 is a sectional illustrative view schematically showing the gasket when the door element is fitted into the container body in FIG. 5.

As shown in FIGS. 1, 5 and 6, open front portion 7 of container body 1 is formed as a rim portion comprised of an inside flange 8 of an approximately frame shape when viewed from front, that is extended sidewards and outwards from the opening rim of container body 1, an inclined flange 9 that is extended frontward (rightwards in the drawing) and inclined outwards, from the distal end of inside flange 8 and will contact the peripheral wall of door element 20, and an outside flange 10 that is extended sidewards and outwards from the distal end of this inclined flange 9.

The inner surface of inside flange 8 forms a flat sealing surface 11 that opposes the rear side of door element 20. This sealing surface 11 is specified so that the difference between the maximum and minimum of the flatness is less than 0.50 mm, preferably not more than 0.45 mm or more preferably not more than 0.20 mm, when measured by a reflection type displacement sensor or a three-dimensional measuring instrument. The reason why the difference between the maximum and minimum of flatness is specified to be less than 0.50 mm is that the sealing performance in long-term preservation of substrates becomes poor if it exceeds 0.50 mm.

Of inclined flange 9 and outside flange 10 of open front portion 7, at least outside flange 10 has an engaging rib 12 of about 3 mm thick for door element 20, projectively formed on either side thereof, as shown in FIG. 1.

A plurality of rear retainers for horizontally supporting the substrates at their rear edge are formed vertically with a predetermined pitch on both sides on the interior rear side wall of container body 1. A pair of attachment ribs 13 for detachable manual control handles are integrally formed on both the exterior side walls of container body 1.

As shown in FIGS. 1, 5 and 6, door element 20 is formed by injection molding using the aforementioned molding material into plate of an approximately rectangular shape, when viewed from front, that corresponds to the open front portion 7 of container body 1, and has on its both sides engaging pieces 25 pivotally supported thereby so as to detachably engage respective engaging ribs 12 of container body 1. This door element 20 includes: a plurality of front retainers 21 formed in parallel at both sides on the rear side thereof for elastically and horizontally supporting substrates at their front edge; and frame-shaped fitting portion 22 that opposes sealing surface 11 of inside flange 8, projectively formed on the rear side thereof circumferentially along the peripheral portion. The outer peripheral side of this fitting portion 22 is partially cut out with respect to the front-to-rear direction (in the left-to-right direction in FIGS. 5 and 6) of the substrate storage container, forming an anti-falling groove 23 for gasket 30.

A pair of opposing supporters 24 vertically arranged apart from each other are projectively formed on either side part of door element 20 while an engaging piece 25 that is automatically or manually operated is pivotally supported by means of a support axis between the above paired supporters 24 so as to be swayable in the front-to-rear direction of the substrate storage container. Engaging piece 25 is given in an approximately plate-like form in which a flexible elastic piece 26 is formed in the center by cutting an approximately U-shaped cutout. The distal end of this elastic piece 26 is buckled to fit engaging rib 12 of container body 1, so as to fix door element 20 that has fitted to open front portion 7 of container body 1.

As shown in FIGS. 2 to 6, gasket 30 is comprised of a base 31 that is fitted to fitting portion 22 of door element 20, a flexible sealing part 34 extended from this base 31 and a soft contact portion 36 that is formed in this sealing part 34 and is put in press-contact with sealing surface 11 of container body 1, and functions to be deformed and compressed by a compression force ranging from 35 to 100 N, preferably 38 to 80 N or more preferably 40 to 60 N when door element 20 is fitted to open front portion 7 of container body 1.

Base 31 is molded in a frame-like form using thermoplastic resin such as polyethylene, polyester, polyolefin or the like with an attachment projection 32 for sealing part 34 formed on its inner peripheral surface and a plurality of reinforcing ribs 33 arranged apart with respect to the longitudinal direction (circumferential direction) on its outer peripheral surface.

Sealing part 34 is molded of, for example a polyester-based or polyolefin-based thermoplastic elastomer or the like, or a fluorine-based thermoplastic elastomer, fluororubber or the like, so that it presents a predetermined surface hardness, bending elasticity and permanent deformation under compression. The sealing part is united to the inner peripheral surface of base 31 by means of attachment projection 32 and extended taperingly toward sealing surface 11, and has an anti-falling claw 35 formed on its peripheral surface to engage anti-falling groove 23 of fitting portion 22.

The surface hardness of sealing part 34 is specified to range from 60° to 80° when measured conforming to JIS-K6301 while the bending elasticity of sealing part 34 is specified to range from 10 to 70 MPa when measured conforming to JIS-K7203 and the permanent deformation under compression of sealing part 34 is specified to be less than 45% when measured conforming to JIS-K6301.

The reason why the bending elasticity of sealing part 34 is specified within the range of 10 to 70 MPa is that when it is less than 10 MPa sticking and other problems are prone to occur whereas when it exceeds 70 MPa the repulsive force arising when door element 20 is fitted to open front portion 7 of container body 1 becomes greater resulting in increase in equipment load. The reason why the permanent deformation under compression is specified to be less than 45% is that if it exceeds 45%, the amount of deformation of gasket 30 becomes so great that sealing performance will degrade under the repeated use.

Contact portion 36 is shaped in a tapered claw-like form when the distal part of sealing part 34 is bent in the direction approximately perpendicular to its direction of extension. The width W (see FIG. 4) from the proximal end of sealing part 34 to the distal end of contact portion 36 is specified to range from 5 to 10 mm or preferably to be 6 mm. The reason why the width W is specified to range from 5 to 10 mm is that if it is less than 5 mm, the amount of flexion is too small to form uniform sealing. In contrast, if it exceeds 10 mm, the amount of deformation at the time of molding becomes so large that the sealing part tends to stick excessively when there is a difference in pressure between the interior and exterior of container body 1.

The reason why the compressive pressure necessary to compress and deform gasket 30 is specified to range from 35 to 100 N is that if it is less than 35 N sufficient enough sealing performance cannot be obtained, whereas if it exceeds 100 N the load acting on the equipment when door element 20 is fitted to open front portion 7 of container body 1 becomes greater.

In the above, when door element 20 is pushed in and fitted into open front portion 7 of container body 1 and engaging pieces 25 of door element 20 become engaged with engaging ribs 12 of open front portion 7, contact portion 36 of gasket 30 comes into press-contact with sealing surface 11 of container body 1 so as to bend sealing part 34 (see FIG. 5), whereby the deformed sealing part 34 seals between open front portion 7 of container body 1 and door element 20, whereby it is possible to suppress and prevent air and others from entering container body 1 from without and contaminating the substrates therein (see FIG. 6).

In this case, when the length of sealing part 34 when contact portion 36 of gasket 30 begins to contact sealing surface 11 of container body 1 is denoted as L1 (see FIG. 5) and the length of sealing part 34 when contact portion 36 of gasket 30 is put in press-contact with sealing surface 11 of container body 1 and flexed is denoted as L2 (see FIG. 6), and the difference between these L1 and L2 is defined as the flexed length FL of sealing part 34 when gasket 30 seals between container body 1 and door element 20, the ratio (W/FL) of width W (mm) from the proximal end of sealing part 34 to the distal end of contact portion 36 to the flexed length FL (mm) of sealing part 34 when gasket 30 seals between container body 1 and door element 20 preferably falls within the range from 1.5 to 4, more preferably within the range from 1.7 to 4.

This is because, that, when the ratio (W/FL) of width W to flexed length FL is less than 1.5, the compression strength of gasket 30 becomes greater or gasket 30 closely sticks to sealing surface 11 so that it becomes difficult to remove door element 20 from container body 1. Conversely, when the ratio (W/FL) of width W to flexed length FL exceeds 4, sealing performance degrades due to dimensional errors and deformation, change in external environment and other factors.

In accordance with the above configuration, since gasket 30 is configured so as to have the above configuration and physical properties, it is possible for gasket 30 to suitably absorb dimensional variations and deformation even if dimensional variations due to lack of uniformity of wall thickness of container body 1 and dimensional variations entailed with degradation of the shape stability of gasket 30 build up. Accordingly, it is possible to tightly seal the full circumference between container body 1 and door element 20, hence it is possible to effectively suppress and prevent air and others from penetrating into container body 1 from without and contaminating the substrates therein.

When door element 20 is fitted to open front portion 7 of container body 1 in which the full number of substrates has been stored in alignment, there occurs the case where the central part of door element 20 swells outwards (frontward) due to repulsive force of front retainer 21. Even in this case, it is possible to prevent the lowering of sealing performance. Further, when the external environment, e.g., temperature and/or humidity, of the substrate storage container, has changed, it is possible to facilitate gasket 30 to follow deformation of container body 1 and door element 20, hence prevent the lowering of sealing performance.

Further, since base 31 of gasket 30 is molded using thermoplastic resin such as polyester, polyolefin, polycarbonate or the like, it is possible to expect markedly improved dimensional accuracy. Moreover, since sealing part 34 of gasket 30 can be formed to have a low hardness by using polyester-based or polyolefin-based thermoplastic elastomer or the like, the sealing performance can be markedly improved.

Figure 7:
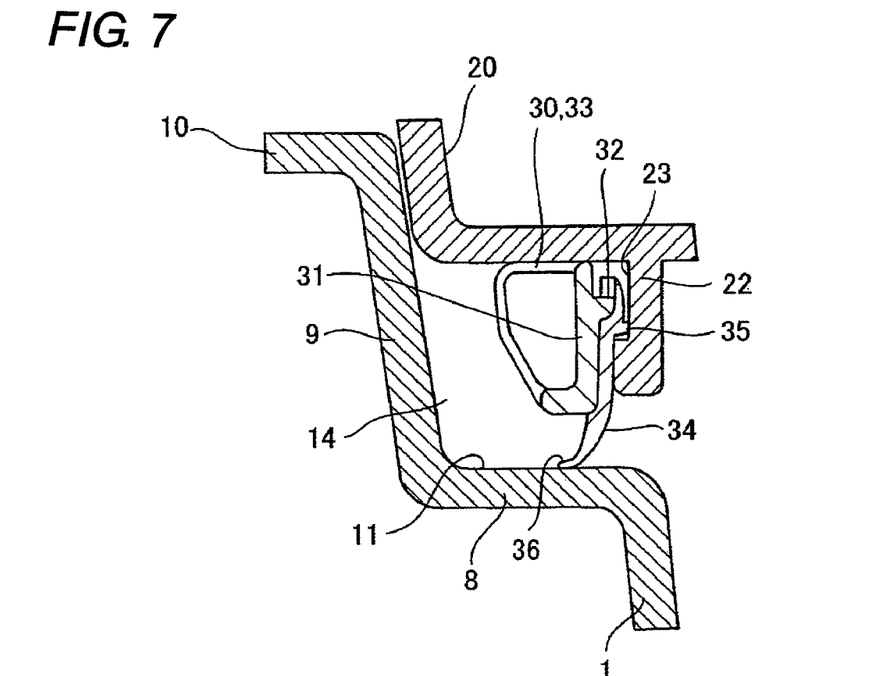
FIG. 7 is a sectional illustrative view schematically showing the relationship between a container body, a door element and a gasket in the second embodiment of a substrate storage container according to the present invention.

Next, FIG. 7 shows the second embodiment of the present invention. This configuration includes: a container body 1 of a top open box type for storing substrates; a door element 20 removably fitted into open top portion 14 of this container body 1; and a compressively deformable endless gasket 30 for sealing between container body 1 and door element 20, and is constructed such that a sealing surface 11 for gasket 30 is formed on the inner periphery of open top portion 14 of container body 1 while door element 20 is formed with a fitting portion 22 for gasket 30 and gasket 30 is formed of a base 31, a sealing part 34 and a contact portion 36. Other components are the same as those in the above embodiment, so that description is omitted.

Also in the present embodiment, the same operation and effect as that of the above embodiment can be expected, and it is obvious that gasket 30 can be widely used regardless of the types and positions of placement of substrates and substrate storage containers.

Next, FIGS. 1, 8 to 10 show the third embodiment of the present invention. In this case, a fitting portion 22A of door element 20 is formed so as to have an approximately U-shaped section. Gasket 30 is formed in a frame shape; sealing part 34 is formed so as to have different lengths between at center portions 30a of two opposing sides among four sides and at corner portion 30b, or is extended so as to be longer at center portions 30a than at corner portion 30b while sealing part 34 is placed so that the center portions 30a are positioned at the areas where the flatness of sealing surface 11 becomes maximum and minimum or in distant sites 11a (see FIG. 1) of sealing surface 11 that are most distant from engaging ribs 12 and engaging pieces 25 of door element 20, or in other words, the center portions are positioned on the sealing surface 11 at top and bottom centers of open front portion 7 of container body 1.

Figure 9:
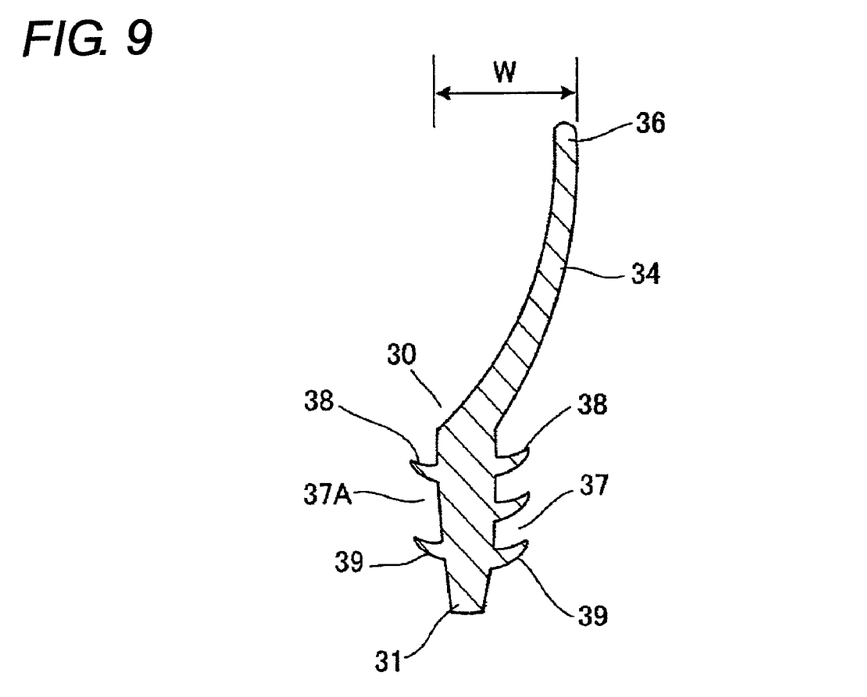
FIG. 9 is a sectional illustrative view cut along a line IX-IX in FIG. 8.
Figure 10:
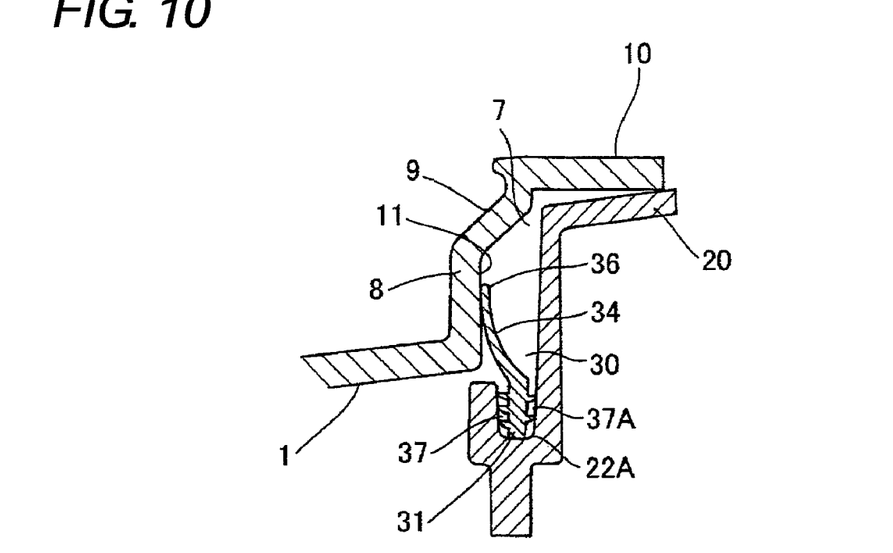
FIG. 10 is a sectional illustrative view schematically showing the gasket when the door element is fitted into the container body in the third embodiment of a substrate storage container according to the present invention.

As shown in FIG. 9, gasket 30 is formed of a base 31 having an approximately rectangular section, to be fitted into fitting portion 22A of door element 20, a flexible sealing part 34 that is formed around the peripheral exposed portion of base 31, exposed from fitting portion 22A and extends obliquely toward sealing surface 11, a contact portion 36 having an approximately semicircular section that is formed at the distal end of this sealing part 34 and put in press-contact with sealing surface 11, a first group of projections 37 that project from one peripheral side of base 31 that opposes the inner surface of fitting portion 22A and is in press-contact with the inner surface of fitting portion 22A and a second group of projections 37A that project from the other peripheral side of base 31 that opposes the opposite inner surface of fitting portion 22A opposite to the inner surface of fitting portion 22A and is in press-contact with the opposite inner surface of fitting portion 22A.

Figure 8:
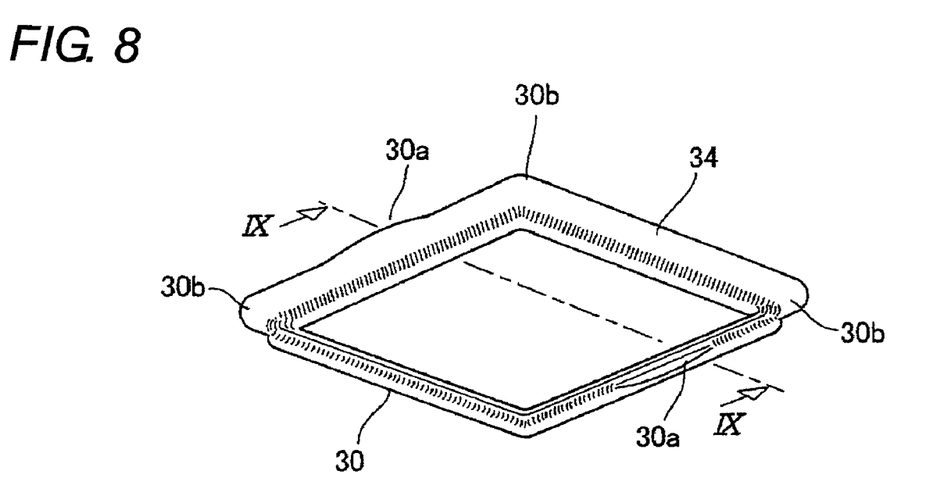
FIG. 8 is a perspective illustrative view schematically showing a gasket of the third embodiment of a substrate storage container according to the present invention.

Sealing part 34 is integrally formed to the peripheral exposed portion of base 31 in an approximately frame shape, and is formed partially longer by about 1 to 1.5 mm at center portions 30a on two sides than in the other portions at corner portions 30b. In this case, sealing part 34 may be formed to be longer continuously and gradually from corner portions 30b of the two sides toward the center portions 30a, forming an approximately semi-elliptic shape so that the outer side of central portion 30a is longest or may be formed so that the outside of center portion 30a is formed in an approximately semi-elliptic shape as shown in FIG. 8.

First and second groups of projections 37 and 37A include tapered, exposed side projections 38 located close to the exposed portion of the peripheral surface of base 31 and tapered normal projections located near the interior bottom of the peripheral surface of base 31, closer to the interior bottom of fitting portion 22A than exposed side projection 38 is. These projections are formed to be gradually shorter from the exposed portion of the peripheral surface of base 31 toward the interior bottom of the peripheral surface. The proximal portions of exposed side projections 38 are formed at approximately opposing positions across base 31 and exposed side projections 38 are formed thicker than normal projections 39.

Exposed side projections 38 in first and second groups of projections 37 and 37A are curvedly formed from the interior bottom side of the peripheral surface of base 31 toward the exposed portion of the peripheral surface. Normal projections 39 in first and second groups of projections 37 and 37A are also curvedly formed from the interior bottom side of the peripheral surface of base 31 toward the exposed portion of the peripheral surface. Other components are the same as those in the above embodiment, so that description is omitted.

Also in the present embodiment, the same operation and effect as that of the above embodiment can be expected. Further, since center portions 30a of sealing part 34 where is extended are located on the sealing surface 11 at top and bottom centers of open front portion 7 of container body 1, or in other words, are located most distant from engaging pieces 25, it is possible to position these portions in the areas where the sealing performance becomes lowest due to curvature of door element 20 or the like. As a result, it is possible to appropriately compensate for a lack of sealing performance. Accordingly, it is obvious that the seal forming margin can be made greater and that a substrate storage container having good sealing performance around the whole circumference of open front portion 7 of container body 1 can be provided.

Next, FIGS. 11 to 17 show the fourth embodiment of the present invention. In this case, open front portion 7 of transparent container body 1, or the inner surface of inside flange 8 of the rim portion that is extended outwards, is formed with a flat sealing surface 11 for a gasket while a plurality of reinforcing ribs 4 and 4A that impart rigidity are formed toward the rim portion and the thickness of opposing proximal portion 4a of each reinforcing rib 4 or 4A to the rim portion of container body 1 is substantially reduced so as to suppress sealing surface 11 of the rim portion from receding when container body 1 is injection-molded.

Figure 11:
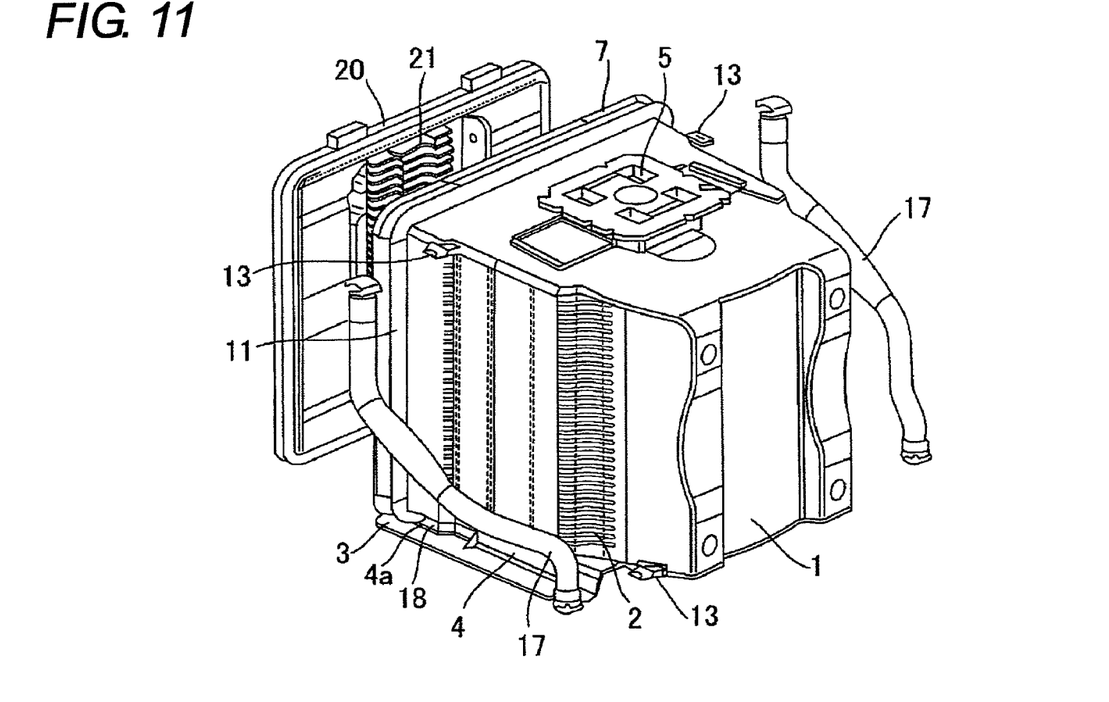
FIG. 11 is an illustrative perspective rear-side view showing the fourth embodiment of a substrate storage container according to the present invention.
Figure 12:
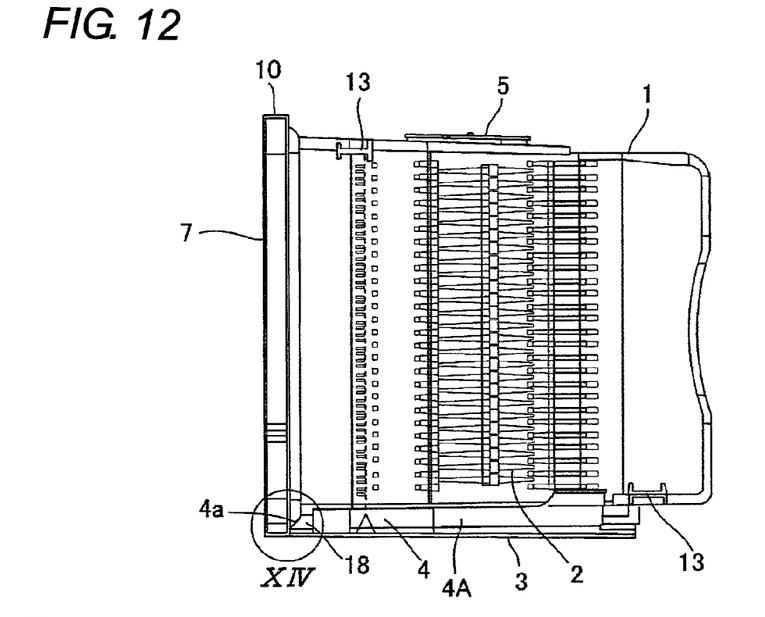
FIG. 12 is an illustrative side view showing the fourth embodiment of a substrate storage container according to the present invention.
Figure 13:
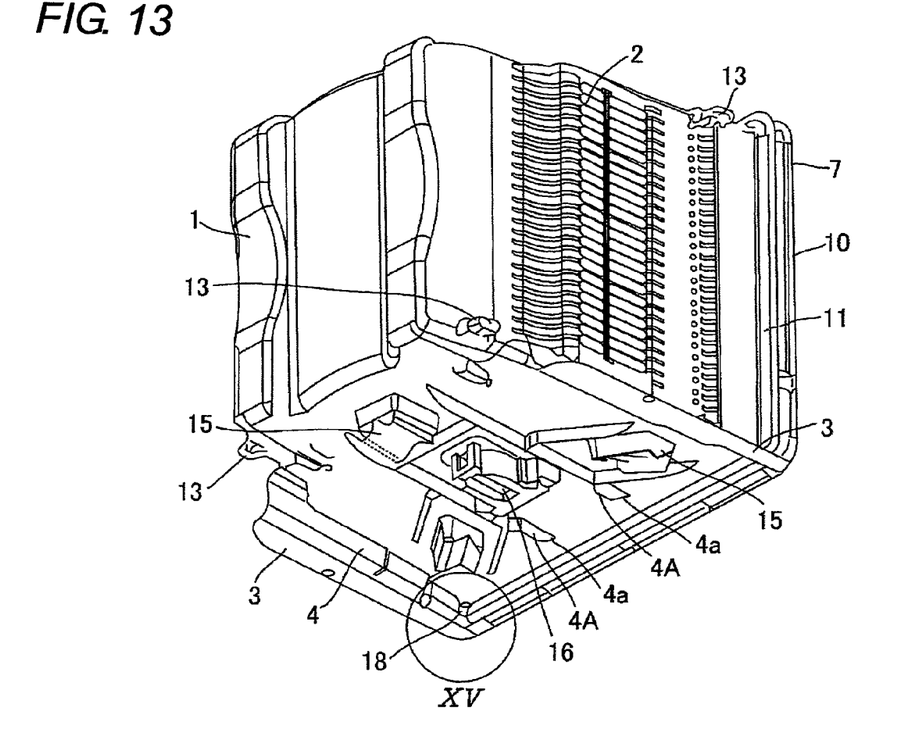
FIG. 13 is an illustrative perspective rear-side view showing the fourth embodiment of a substrate storage container according to the present invention, when viewed from the bottom side.
Figure 14:
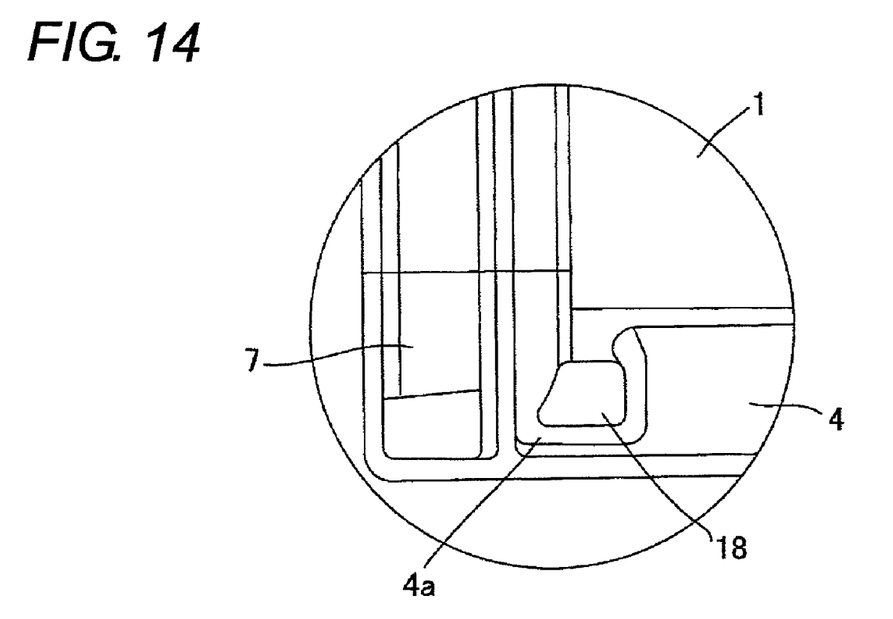
FIG. 14 is an illustrative view showing a XIV portion in FIG. 12.
Figure 15:
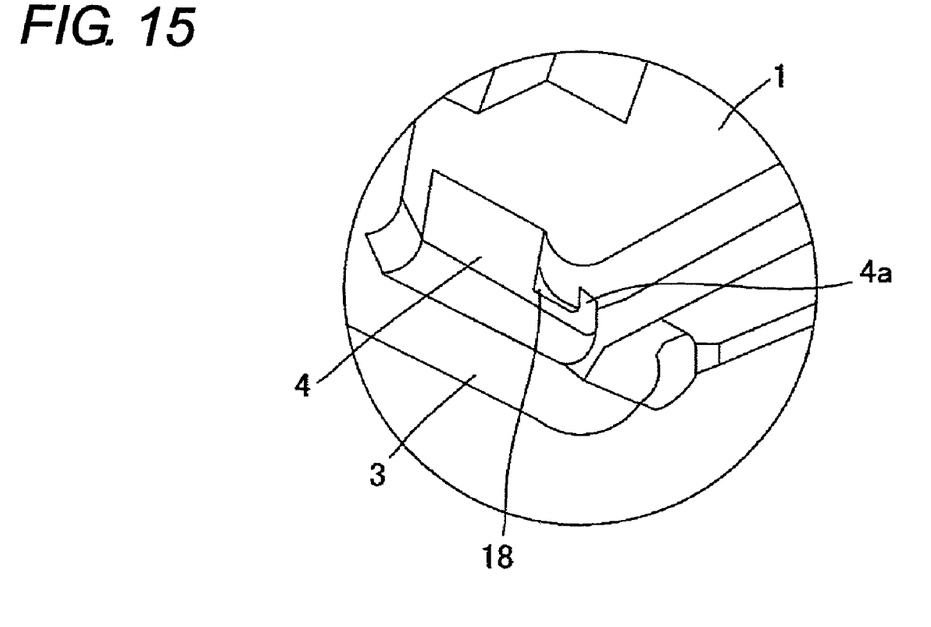
FIG. 15 is an illustrative view showing a XV portion in FIG. 13.
Figure 16:
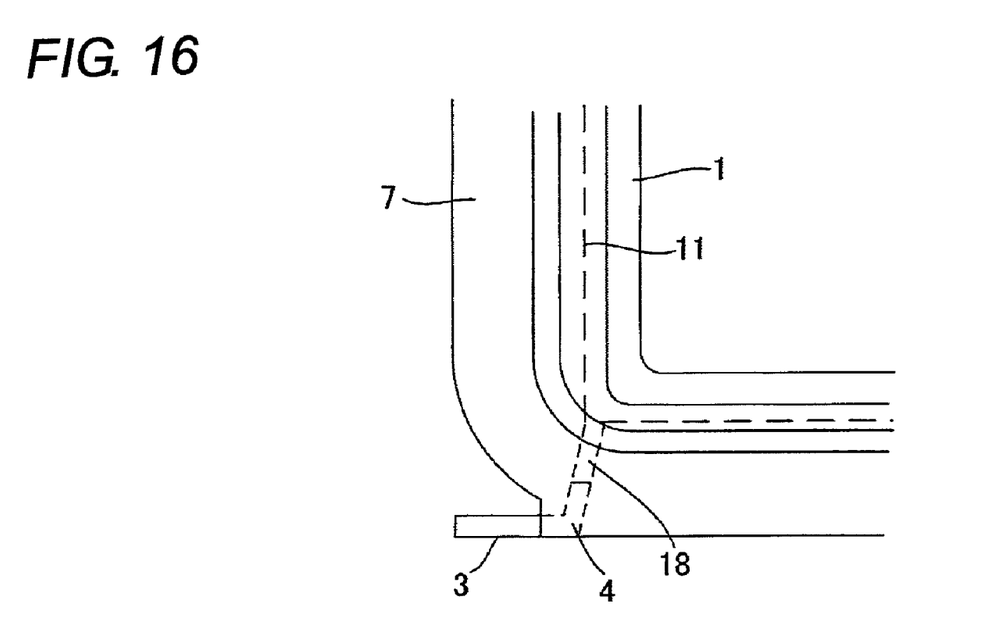
FIG. 16 is a partial illustrative view from the front side, showing the fourth embodiment of a substrate storage container according to the present invention.
Figure 17:
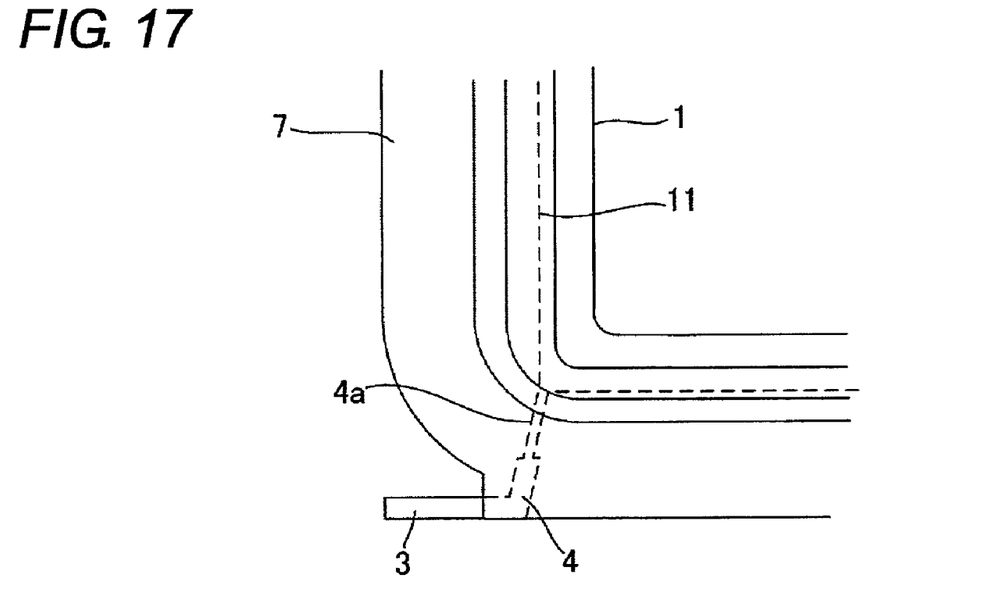
FIG. 17 is a partial illustrative view from the front side, showing the fifth embodiment of a substrate storage container according to the present invention.

As shown in FIGS. 11 to 13, a container body 1 basically has the same configuration as the above embodiment, but a plurality of positioning tools 15 arranged in a predetermined pattern and an engaging tool 16 for fixture to substrate processing equipment are attached to the bottom surface at the bottom while an obliquely bent rod-like manual control handle 17 is attached in a removable manner by a plurality of attachment ribs 13 on the outside wall on either side. The open front portion 7 of this container body 1 has a plurality of indentations formed apart from each other on its inner periphery so that a door element 20 having a pair of door latch mechanisms is removably fitted therein.

Door element 20 incorporates a pair of door latch mechanisms that can be operated from without, arranged a distance apart with respect to the lateral direction. Each door latch mechanism is operated from without so that its engaging parts at the distal ends are retractably inserted into and engaged with the indentations of open front portion 7 of container body 1 through the through holes on the peripheral wall of door element 20. Further, as shown in FIG. 11, a front retainer 21 for horizontally supporting substrates on the front periphery in a resilient manner is attached in the center on the rear side of door element 20.

A plurality of reinforcing ribs 4 and 4A are formed including, for example, a plurality of reinforcing ribs 4 projectively formed on both sides at the bottom of container body 1 to support bottom rails 3 for transportation and a plurality of reinforcing ribs 4A extended in the front-to-rear direction of container body 1 in parallel to each other on the bottom surface at the bottom of container body 1 with engaging tool 16 held at the center of the bottom surface therebetween. As shown in FIGS. 11 to 16, each reinforcing rib 4 is formed of, for example an elongate plate piece extended in the front-to-rear direction of container body 1 with its front end formed to be opposing proximal portion 4a while this opposing proximal portion 4a is joined from the rear to the rim portion of container body 1. A through hole 18 for reduction in thickness is formed from the side in this opposing proximal portion 4a. Perforation of this through hole 18 reduces the thickness of opposing proximal portion 4a compared to the case where no through hole 18 is formed.

As shown in FIG. 13, each reinforcing rib 4A is formed of an elongate plate piece tapering toward the front and rear ends. The front end is formed to be opposing proximal portion 4a, and this opposing proximal portion 4a is not joined from the rear to the rim portion of container body 1. This discontinuity reduces the thickness of opposing proximal portion 4a compared to the case where it is continuously jointed to the rim portion. The other components are the same as those in the above embodiment, so that description is omitted.

Also, in the present embodiment, the same operation and effect as that of the above embodiment can be expected. Further, perforation of through hole 18 in opposing proximal portion 4a of each reinforcing rib 4 can prevent opposing proximal portion 4a of thick reinforcing rib 4 from being directly jointed to the rim portion of container body 1, in other words, the rear side of sealing surface 11 and can reduce the thickness of opposing proximal portion 4a hence make the area practically uniform in thickness in the same manner as the other areas. Accordingly, it is possible to effectively exclude the risk of formation of a depression in sealing surface 11 of open front portion 7 during injection molding due to generation of sink marks in open front portion 7 of container body 1 which would be accompanied with increase in thickness, hence it is possible to markedly improve sealing performance.

Further, since opposing proximal portion 4a of each reinforcing rib 4A is shortened and configured in a discontinuous manner, it is possible to prevent opposing proximal portion 4a of reinforcing rib 4A from being directly jointed to the rim portion of container body 1, in other words, the rear side of sealing surface 11, reduce the thickness of opposing proximal portion 4a and make the area practically uniform in thickness. Accordingly, it is possible to effectively exclude the risk of formation of a depression in sealing surface 11 of open front portion 7 during injection molding due to generation of sink marks in open front portion 7 of container body 1 which would be accompanied with increase in thickness, hence it is possible to markedly improve sealing performance.

Further, perforation of through hole 18 in opposing proximal portion 4a of each reinforcing rib 4 enables smooth flow of a liquid and gas through the areas enclosed by multiple reinforcing ribs 4. This improves circulation of rinsing water during washing and ventilation during drying, hence it is possible to expect remarkable improvement of washing performance and drying efficiency.

Here, in the above embodiment, a plurality of positioning tools are attached in a predetermined pattern of arrangement at the bottom of container body 1, but the embodiment should not be limited to this. For example, a plate-like bottom plate may be detachably mounted to the bottom of container body 1, together with a plurality of positioning tools, or a plurality of positioning tools may be attached to a bottom plate in a predetermined pattern of arrangement. Alternatively, an identifier for providing the information on the type and number of substrates may be provided for the bottom plate, in an openable manner or in a removable manner.

Further, at least part of the bottom plate is formed in a structure having an approximately L-shaped section so that the upright piece is arranged so as to oppose the backside wall of container body 1 and a RF tag for a RFID system or a barcode may be attached to the upright piece of this bottom plate. Container body 1 may be given in a box-like form, a bottomed cylindrical form or the like. Further, as long as it will not hinder, the inner surface of inclined flange 9 may be formed to be flat sealing surface 11, instead of inside flange 8. Also, the fitting portion 22 arranged circumferentially along the periphery of the rear side of door element 20 may be formed in a configuration having an approximately C-shaped, approximately L-shaped or approximately V-shaped section.

It is also possible to shorten sealing part 34 in the portions where it contacts the areas in which the flatness of sealing surface 11 is raised. Further, first and second groups of projections 37 and 37A may be formed of a plurality of normal projections 39 which are projected from the peripheral surface sides of base 31 to come into press-contact inside fitting portion 22A. Further, though opposing proximal portion 4a of reinforcing rib 4 may be joined from behind to the rim portion of container body 1 whilst forming through hole 18, it is also possible to reduce the thickness of opposing proximal portion 4a of reinforcing rib 4 or 4A by reducing the thickness of joined opposing proximal portion 4a to as thin as or thinner than ⅔ or preferably ½ of the proximal portion.

EXAMPLES

Next, the examples of substrate storage containers according to the present invention will be described with comparative examples.

Example 1

A substrate storage container according to the first embodiment was sealed at −0.3 Pa relative to the external air pressure, and the sealing performance of this substrate storage container was tested. The result is shown in Table 1. At test, the difference in flatness in the sealing surface of the container body and the compressive force needed to compress and deform the gasket were determined.

The difference (mm) in flatness was determined based on the difference between the maximum and the minimum when it was measured along the entire circumference of the sealing surface. The compressive force (N) required to compress and deform the gasket was measured when the door element was pressed and fitted into the open front portion of the container body without any substrate stored therein.

Figure 4:
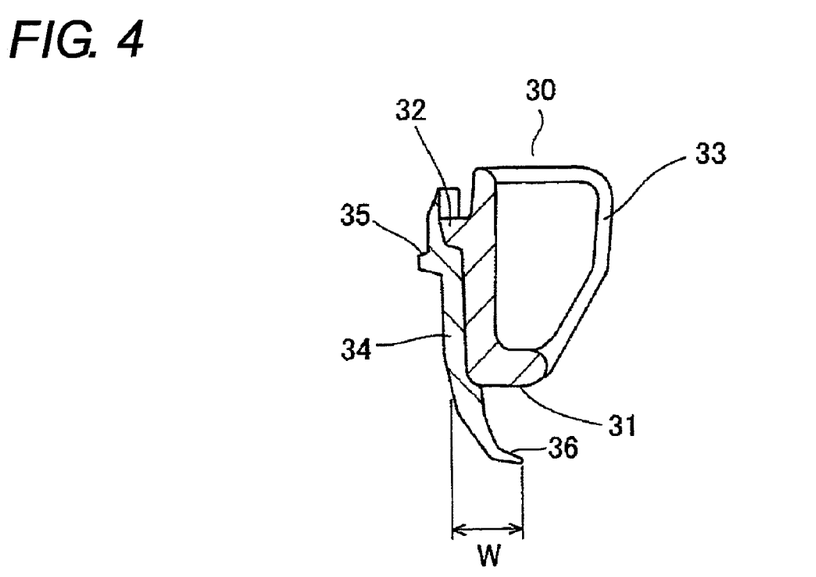
FIG. 4 is a partially enlarged sectional view schematically showing the IV portion in FIG. 3.

The gasket of the substrate storage container was formed by molding a frame-like base of polycarbonate and molding a sealing part having an elasticity of 16 MPa of polyester-based thermoplastic elastomer with the base so that it has a sectional configuration shown in FIG. 4. The ratio (W/FL) of width W (mm) from the proximal end of the sealing part to the distal end of the contact portion to flexed length FL (mm) of the sealing part when the gasket seals between the container body and the door element was adapted to be 1.5.

Example 2

Though this was basically the same as example 1, the ratio (W/FL) of width W from the proximal end of the sealing part to the distal end of the contact portion to flexed length FL of the sealing part when the gasket seals between the container body and the door element was adapted to be 4.

Example 3

The substrate storage container of the third embodiment was molded under the condition in which the temperature of the die for molding when it was molded was raised 5 deg.C higher than the normal condition (70 deg.C to 80 deg.C) so that sink would be prone to occur. The container was sealed at a pressure of −0.3 Pa relative to the external air pressure, and the sealing performance of this substrate storage container was tested. The result is shown in Table 1.

The gasket of the substrate storage container was formed so as to have a section shown in FIG. 9 using polyester-based thermoplastic elastomer having an elasticity of 16 MPa for the base, first and second groups of projections and the sealing part.

The length of the sealing part in the center portions of the two opposing sides of the gasket was made greater by 1 mm than the length of the sealing part at the corner portion. Further, the ratio (W/FL) of width W from the proximal end of the sealing part to the distal end of the contact portion to flexed length FL of the sealing part when the gasket seals between the container body and the door element was adapted to be 1.5. The other components were the same as those in example 1.

Example 4

Though this was basically the same as example 3, the ratio (W/FL) of width W from the proximal end of the sealing part to the distal end of the contact portion to flexed length FL of the sealing part when the gasket seals between the container body and the door element was adapted to be 4.

Example 5

A container body having a rim portion with through holes for reducing thickness, perforated at the intersections where reinforcing ribs are joined to this rim portion as shown in the fourth embodiment, was used. As a gasket, the type formed of polyester-based thermoplastic elastomer, having a section shown in FIG. 9 was fitted to the door element and used. The length of the sealing part of this gasket was made uniform along the whole circumference.

Example 6

Of the container bodies in the fourth embodiment, a type of which the thickness of the reinforcing rib that is joined to the rim portion of the container body is made two-thirds thinner than the proximal portion was used. As the gasket, the type from example 5 was used.

Comparative Example 1

Though this was basically the same as example 1, the gasket was formed by molding a sealing part having an elasticity of 16 MPa of polyester-based thermoplastic elastomer to the base so that it has a sectional configuration shown in FIG. 4. The ratio (W/FL) of width W (mm) from the proximal end of the sealing part to the distal end of the contact portion to flexed length FL (mm) of the sealing part when the gasket seals between the container body and the door element was adapted to be 1.

Figure 18:
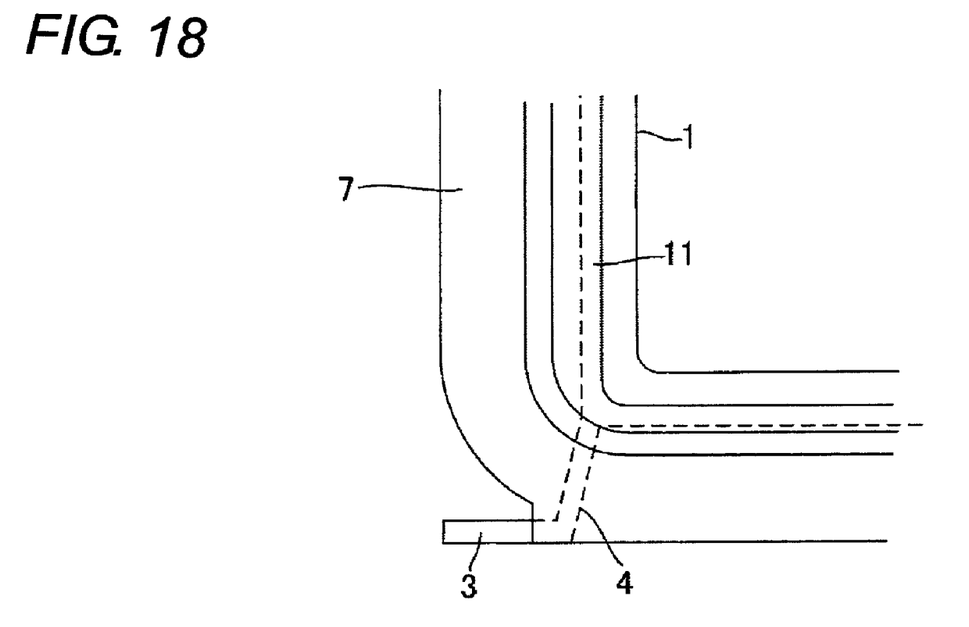
FIG. 18 is an illustrative view from the front side, showing a conventional substrate storage container.

Here, as to the container body, the type of which reinforcing ribs are joined to the open front portion with their thickness unchanged as shown in FIG. 18 was used, and the container body was molded under the condition in which the temperature of the die for molding when it was molded was raised 10 deg.C higher than the normal condition (70 deg.C to 80 deg.C) so that sink would be prone to occur.

Comparative Example 2

Though this was basically the same as example 1, the gasket was formed by molding a sealing part having an elasticity of 16 MPa of polyester-based thermoplastic elastomer to the base so that it has a sectional configuration shown in FIG. 4. The ratio (W/FL) of width W (mm) from the proximal end of the sealing part to the distal end of the contact portion to flexed length FL (mm) of the sealing part when the gasket seals between the container body and the door element was adapted to be 5.

Here, a container body of the type having reinforcing ribs that are joined to the open front portion with their thickness unchanged as shown in FIG. 18 was used, and the container body was molded under the condition in which the temperature of the die for molding when it was molded was raised 10 deg.C higher than the normal condition (70 deg.C to 80 deg.C) so that sink would be prone to occur.

TABLE 1

|  | Width W from proximal end of sealing part to distal end of contact portion (mm) | Flexed length FL of sealing part when gasket seals between container body and door element (mm) | W/FL | Gasket compressive force (N) | Difference in sealing surface flatness (mm) | Seal retention time (min) |
| --- | --- | --- | --- | --- | --- | --- |
| Example 1 | 6 | 1.5 | 4 | 38 | 0.30 | 15 |
| Example 2 | 6 | 4 | 1.5 | 48 | 0.30 | 15 |
| Example 3 | 10 | 3.5 | 3 | 46 | 0.45 | 15 |
| Example 4 | 8 | 2 | 2 | 45 | 0.45 | 15 |
| Example 5 | 8 | 2 | 2 | 44 | 0.10 | 20 |
| Example 6 | 8 | 2 | 2 | 45 | 0.20 | 15 |
| Comparative example 1 | 4 | 4 | 1 | 85 | 0.50 | 5 |
| Comparative example 2 | 10 | 2 | 5 | 35 | 0.50 | 6 |

The invention claimed is:

1. A substrate storage container comprising:
a container body for storing substrates;
a door element fitted to an opening of the container body; and
a compressively deformable gasket for sealing between the container body and the door element;
wherein a gasket fitting portion is formed on one of an inner periphery of the opening of the container body or the door element while a sealing surface for the gasket is formed on an opposing one of the door element or the inner periphery of the opening of the container body such that a difference between a maximum and a minimum of a flatness of the sealing surface is less than 0.50 mm,
wherein the gasket comprises:
  a base fitted to the fitting portion;
  a flexible sealing part extended from the base toward the sealing surface; and
  a contact portion formed in the sealing part and contacts the sealing surface,
wherein the gasket is formed in a frame shape,
wherein the sealing part is approximately in a shape of a rectangular cylinder; wherein the sealing part comprises: a first group of tapered projections on an outer peripheral side and a second group of tapered projections on an inner peripheral side, wherein each of the first and second groups of tapered projections includes at least two projections having a substantively same shape but a different size from one another, and
wherein the sealing part is molded of thermoplastic elastomer or rubber.

2. The substrate storage container according to claim 1, wherein a compressive force necessary to compress and deform the gasket when the door element is fitted into the opening of the container body is specified to range from 35 to 100 N.

3. The substrate storage container according to claim 1, wherein the substrates are semiconductor wafers having a diameter of 300 mm or greater, the container body is constructed of a front open box for storing semiconductor wafers of 300 mm or greater in diameter, with its front side formed as the opening, and a plurality of ribs are formed near a rim of the opening.

4. The substrate storage container according to claim 3, wherein engaging ribs are formed on both sides of the rim of the opening of the container body while the door element has engaging pieces pivotally supported on both sides thereof to be engaged with the engaging ribs of the container body.

5. The substrate storage container according to claim 1, wherein a distal end of the sealing part is formed to be the contact portion, and a width W from a proximal end of the sealing part to the distal end of the contact portion is specified to range from 5 to 10 mm.

6. The substrate storage container according to claim 5, wherein a ratio (W/FL) of the width W (mm) from the proximal end of the sealing part to the distal end of the contact portion to a flexed length FL (mm) when the gasket seals between the container body and the door element is specified to range from 1.5 to 4.

7. The substrate storage container according to claim 1, wherein the sealing part in the partial section is positioned in an area where the sealing surface flatness becomes maximum or minimum, or in a center portion, or in an area on the sealing surface most distant from engaging pieces of the door element.

8. The substrate storage container according to claim 7, wherein the sealing part in the partial section is positioned in the area where the flatness of the sealing surface varies.

* * * * *